US007288206B2

(12) United States Patent
Nishimura

(10) Patent No.: US 7,288,206 B2
(45) Date of Patent: Oct. 30, 2007

(54) HIGH-PURITY ALKALI ETCHING SOLUTION FOR SILICON WAFERS AND USE THEREOF

(75) Inventor: Shigeki Nishimura, Yamaguchi (JP)

(73) Assignee: Siltronic AG, Munich (DE)

(*) Notice: Subject to any disclaimer, the term of this patent is extended or adjusted under 35 U.S.C. 154(b) by 116 days.

(21) Appl. No.: 11/020,832

(22) Filed: Dec. 22, 2004

(65) Prior Publication Data

US 2005/0133759 A1    Jun. 23, 2005

(30) Foreign Application Priority Data

Dec. 22, 2003    (JP) ............... 2003-425672

(51) Int. Cl.
*B44C 1/22* (2006.01)
(52) U.S. Cl. .................. 216/83; 216/38; 216/67; 216/88; 216/89; 252/79.1; 438/471; 438/691; 438/692; 438/749
(58) Field of Classification Search .............. 252/79; 216/83, 88; 438/471
See application file for complete search history.

(56) References Cited

U.S. PATENT DOCUMENTS

| 6,225,136 B1* | 5/2001 | Lydon et al. ............ 438/14 |
| 6,238,272 B1* | 5/2001 | Tanaka et al. ............ 451/41 |
| 6,338,805 B1* | 1/2002 | Anderson ............ 216/89 |
| 6,346,485 B1* | 2/2002 | Nihonmatsu et al. ....... 438/749 |
| 6,844,269 B2* | 1/2005 | Miyazaki ............ 438/753 |
| 2002/0028632 A1* | 3/2002 | Shimamoto et al. .......... 451/36 |

FOREIGN PATENT DOCUMENTS

| EP | 1 168 423 A | 1/2002 |
| JP | 11-150106 A | 6/1999 |
| JP | 11-162953 A | 6/1999 |
| JP | 9-78276 | 12/2002 |

OTHER PUBLICATIONS

Patent Abstracts of Japan corres. to JP 11-162953.
Patent Abstracts of Japan corres. to JP -11-150106.
Fumio Shimura, "Semiconductor Silicon Crystal Technology", Academic Press, 1989, pp. 182-197.
Patent Abstract of Japan corresponding to JP9-78276, 1998.

* cited by examiner

*Primary Examiner*—Lan Vinh
*Assistant Examiner*—Maki Angadi
(74) *Attorney, Agent, or Firm*—Brooks Kushman P.C.

(57) ABSTRACT

A high-purity alkali etching solution for silicon wafers results in silicon wafers with extremely low metal impurity contamination, and excellent surface flatness. The alkali etching solution contains sodium hydroxide containing 1 ppb or less of the elements Cu, Ni, Mg, and Cr, 5 ppb or less of the elements Pb and Fe, 10 ppb or less of the elements Al, Ca, and Zn, and 1 ppm or less of chloride, sulfate, phosphate, and nitrogen compounds other than nitrate and nitrite, and containing 0.01 to 10 wt % of nitrate and/or nitrite.

12 Claims, 1 Drawing Sheet

100.4 μm 100.4 μm

HIGH-PURITY ALKALI ETCHING SOLUTION FOR SILICON WAFERS AND USE THEREOF

BACKGROUND OF THE INVENTION

1. Field of the Invention

The present invention relates to a high-purity alkali etching solution for silicon wafers and a method for etching silicon wafers using the solution.

2. Background Art

In producing silicon wafers for use, e.g. in integrated circuits such as an IC or an LSI and for manufacturing individual semiconductor devices such as transistors and diodes, silicon wafers are generally manufactured by cutting a single crystal obtained by the Czochralski method (CZ method) or by the Floating Zone method (FZ method) with an inner blade saw or a wire saw, chamfer processing the periphery, lap processing at least one surface with free abrasives to improve the surface flatness, followed by wet etching the wafer to eliminate processing distortion introduced during these processes; and then mirror polishing the wafer. One type of wet etching which has been employed to eliminate process distortion is alkali etching using an alkali such as sodium hydroxide or potassium hydroxide. Such alkali etching has the advantage of obtaining good surface flatness of the wafer after etching, since the alkali etching rate is slow, but has the disadvantage of diffusing metal impurities included in the alkali etching solution into the wafer during the etching process.

SUMMARY OF THE INVENTION

An object of the present invention is to provide high-purity etching solutions for silicon wafers which do not exhibit the drawbacks mentioned above, and a process for etching silicon wafers by use of these alkali etching solutions.

The present inventors have surprisingly discovered that the drawbacks above-mentioned can be eliminated by using an extremely high-purity sodium hydroxide solution which also contains nitrate and/or nitrite ions as an etching solution.

DETAILED DESCRIPTION OF THE PREFERRED EMBODIMENTS

Figure 1:
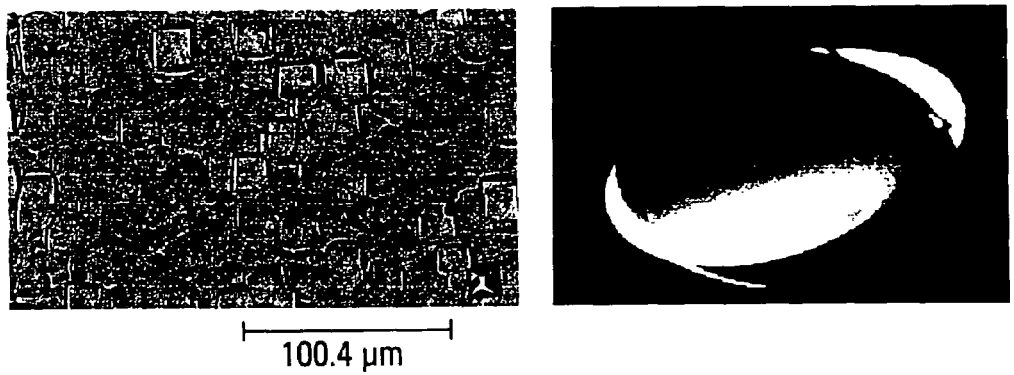
FIG. 1 shows a photomicrograph of the wafer surface obtained in Example 2.

Thus, the alkali etching solution according to the present invention contains sodium hydroxide containing 1 ppb or less of the elements Cu, Ni, Mg, and Cr, 5 ppb or less of the elements Pb and Fe, 10 ppb or less of the elements Al, Ca, and Zn, 1 ppm or less of chloride, sulfate, phosphate, nitrogen compounds other than nitrates and nitrites, and which preferably contains 40 to 60 wt % of sodium hydroxide and 0.01 to 10 wt % of nitrate and/or nitrite.

The present invention further includes a production method for silicon wafers comprising alkali etching of the silicon wafers by using the inventive alkali etching solution, wherein the alkali etching solution contains sodium hydroxide having 1 ppb or less of the elements Cu, Ni, Mg, and Cr, 5 ppb or less of the elements Pb and Fe, 10 ppb or less of the elements Al, Ca, and Zn, 1 ppm or less of chloride, sulfate, phosphate, nitrogen compounds other than nitrate and nitrite, and contains 0.01 to 10 wt % of nitrate and/or nitrite, providing $1 \cdot 10^{10}$ atoms/cm$^2$ or less of heavy metal contamination of the wafer surface after etching and having 1 µm or less degradation of the surface flatness (Δ TTV=TTV before etching−TTV after etching).

The alkali etching solution according to the present invention uses high-purity sodium hydroxide containing very few metal impurities. Moreover, the presence of nitrite ion and/or nitrate ion in the alkali etching solution allows for minimizing uneven etching, and allows the production of silicon wafers having 1 ppb or less of the elements Cu, Ni, Mg, and Cr, 5 ppb or less of the elements Pb and Fe, 10 ppb or less of the elements Al, Ca, and Zn, 1 ppm or less of chloride, sulfate, phosphate, and nitrogen compounds, with exceptional surface flatness.

The alkali etching solution according to the present invention differs from conventional etching solutions, and contains extremely few metal impurities, both of nonionic and ionic forms, and not limited by the type of metal. In the present invention, ail metals which are known to diffuse into the wafer during alkali etching and which degrade the quality of the wafer are preferably excluded, most preferably transition metals. Among them, in particular, iron, nickel, copper, and chromium are present in exceptionally small concentrations.

The phrase "containing very few metal impurities" herein refers in particular to 1 ppb or less of the elements Cu, Ni, Mg, and Cr, 5 ppb or less of the elements Pb and Fe, 10 ppb or less of the elements Al, Ca, and Zn, and 1 ppm or less of chloride, sulfate, phosphate, and nitrogen compounds other than nitrate or nitrite. The solutions preferably contain the aforementioned impurities in the least amount possible. Alkali etching solutions containing such low amounts of metal impurities have not been previously used in the alkali etching of conventional silicon wafers.

The concentration of sodium hydroxide in the alkali solution which is preferably used in the present invention spans a wide range, and is selected to attain the desired etching rate. Preferably, the alkali concentration ranges from 20 to 70 wt %, more preferably from 40 to 60 wt %, and most preferably, from 50 to 55 wt %.

The method of production of the alkali solution containing extremely low amounts of metal impurities is not limited, and the solution can be obtained by conventional chemical and/or electrochemical methods that are able to provide the high-purity necessary for these solutions. Preferably, an electrochemical method such as that disclosed in Japanese Patent No. 3380658, is employed. Alternatively, other methods which produce solutions containing more than the desired amount of metal impurities may be employed, followed by reducing the content of metal impurities to below the desired concentration by conventional purification techniques.

In the alkali etching of the present invention, salts (or acids) are added to control uneven etching which may occur on the silicon wafer surface when using high-purity sodium hydroxide solution alone. The present have found that etching using a high-purity alkali solution alone provides a silicon wafer having extremely low amounts of metal impurities, but also causes uneven etching on the silicon wafer surface, which highly degrades the surface flatness after etching. However, the inventors have found that uneven etching can be controlled by adding certain salts (or acids) to the alkali solution.

In the present invention, the addition of nitrate and/or nitrite is mandatory to control uneven etching, and in addition, further salts (or acids) can be added to provide further control. Salts which can be added to the alkali solution for this purpose, are not particularly limited. Various kinds of salts and concentrations can be selected for additional control of the desired uneven etching. The concentration of the added salts is not limited. The concentration of the salts may, for example, range from 0.01 to 20 wt %, preferably from 0.05 to 10 wt %. Moreover, acids can be added to the alkali solution. In this case, desired concentration of salts is produced by neutralization of the added acid with the alkali, which is necessarily present. The alkali etching solution for high-purity silicon wafer according to the present invention can be stored in the same manner as conventional alkali etching solutions.

The alkali etching method according to the present invention comprises using the inventive alkali etching solution described above. The etching conditions used in the alkali etching method of the present invention may be those conventionally used, and are not particularly limited. The conditions used for ordinary known alkali etching solutions are preferably employed. Specifically, the etching solution concentration in terms of alkali, the amount of etching solution, the etching time, the temperature, and the degree of agitation and any further parameters may be those conventionally used.

Moreover, the equipment used in the alkali etching method of the invention are not particularly restrained. Equipment used for conventional alkali etching solution is preferably used. In particular, attention should be directed to the possibility of contamination of metal impurities derived from the equipment which contacts the alkali etching solution.

The silicon wafers produced by the present invention not only have extremely low amounts of metal impurities, but also have exceptional surface flatness. Types and amounts of metal impurities and the degree of diffusion of the metal impurities into the wafer can be estimated by variety of conventional methods of measurement. Specifically, atomic absorption spectrometry and inductively coupled plasma-mass spectrometry are very useful. Moreover, the surface flatness of the silicon wafer can be estimated by variety of conventional measurements, specifically, flatness measuring devices such as Ultrascan (ADE Corporation) and MX302 (E+H Corporation).

The present invention will be explained in detail by the examples below, which should be viewed as illustrative, and not as limiting.

EXAMPLE 1

An alkali etching solution is prepared by dissolving 0.05 wt % of sodium nitrate (top grade reagent; Wako Pure Chemical Industries, Ltd.) to a 48 wt % high-purity sodium hydroxide solution (CLEARCUT-S 48%; Tsurumi Soda Co., Ltd.). The prepared alkali etching solution is poured into a square etch/processing bath of 15 L volume. Lapped 200 mm diameter silicon wafers are loaded onto the carrier and dipped in the alkali etching solution. 25 μm etching is conducted by processing the wafers for 7 to 11 minutes at 85° C. solution temperature. Then, the wafers are transferred to a washing bath to be washed and dried.

By the tests described below, the etching rate, the visible test, the roughness, the glossiness, Δ TTV, and the amount of metal contamination of the wafer surface of the etched wafers are measured. The results obtained are summarized in Table 1. The visible tests, roughness, glossiness, and Δ TTV measurements are conducted as described below.

(1) Etching rate: (thickness before etching–thickness after etching)/etching time. The thickness of a wafer may be measured as an average thickness or as a center thickness. In these examples, center thickness was employed.

(2) Visible test: the surface of the wafer is exposed to 105,000 lux of light from a halogen lamp in a darkroom, and the presence or absence of uneven etching is observed by the naked eye.

(3) Roughness: Ra is measured by SJ-201P (Mitutoyo Corporation.).

(4) Glossiness: Measured by PG-1M (Nippon Denshoku Industries Co., Ltd.).

(5) Δ TTV: TTV after etching–TTV before etching.

(6) The amount of metal contamination of the wafer surface: Measured by atomic absorption spectrometry or ICP-MS (inductively coupled plasma-mass spectrometry).

EXAMPLE 2

An etching solution is prepared as in Example 1 but the concentration of sodium nitrate is 0.1 wt %. Moreover, the etching process of the silicon wafer is conducted in the same manner as Example 1. The etching rate, the visible test, roughness, glossiness, Δ TTV, and the amount of metal contamination of the wafer surface of the etched wafer are measured. The results obtained are summarized in Table 1. A photograph during the visual check and the results of uneven etching on the surface of the wafer as observed by optical microscopy (1250×) are shown in FIG. 1.

EXAMPLE 3

An etching solution is prepared as in Example 1, but the concentration of sodium nitrate is 1.0 wt %. The etching process is also conducted as in Example 1. The etching rate, the visible test, roughness, glossiness, Δ TTV, and the amount of metal contamination of the wafer surface of the etched wafer are measured and summarized in Table 1.

EXAMPLE 4

An etching solution is prepared as in Example 1, but the concentration of sodium nitrate is 5 wt %, and wafers are etched as in Example 1. The etching rate, the visible test, roughness, glossiness, Δ TTV, and the amount of metal contamination of the wafer surface are measured and summarized in Table 1.

EXAMPLE 5

An etching solution is prepared as in Example 1. but the concentration of sodium nitrate is 10 wt %, and wafers are etched as in Example 1. The etching rate, the visible test, roughness, glossiness, Δ TTV, and the amount of metal contamination of the wafer surface are measured and summarized in Table 1.

EXAMPLE 6

An etching solution is prepared as Example 2, but sodium nitrate was replaced by sodium nitrite, and wafers are etched as in Example 1. The etching rate, the visible test, roughness, glossiness, Δ TTV, and the amount of metal contamination of the wafer surface are measured and summarized in Table 1.

EXAMPLE 7

An etching solution is prepared as in Example 3, but the concentration of sodium hydroxide is 30 wt %, and wafers are etched as in Example 1. The etching rate, the visible test, roughness, glossiness, Δ TTV, and the amount of metal contamination of the wafer surface are measured and summarized in Table 1.

EXAMPLE 8

An etching solution is prepared as in Example 2, but sodium nitrate was replaced by potassium nitrate, and wafers are etched as in Example 1. The etching rate, the visible test, roughness, glossiness, Δ TTV, and the amount of metal contamination of the wafer surface are measured and summarized in Table 1.

EXAMPLE 9

An etching solution is prepared as in Example 2, but sodium nitrate was replaced by potassium nitrite, and wafers are etched as in Example 1. The etching rate, the visible test, roughness, glossiness, Δ TTV, and the amount of metal contamination of wafer surface are measured and summarized in Table 1.

EXAMPLE 10

An etching solution is prepared as in Example 2, but sodium nitrate was replaced by lithium nitrate, and wafers are etched as in Example 1. The etching rate, the visible test, roughness, glossiness, Δ TTV, and the amount of metal contamination of wafer surface are measured and summarized in Table 1.

EXAMPLE 11

An etching solution is prepared as in Example 2, but the concentration of sodium hydroxide is 51 wt %, and wafers are etched as in Example 1. The etching rate, the visible test, roughness, glossiness, Δ TTV, and the amount of metal contamination of the wafer surface are measured and summarized in Table 1.

COMPARATIVE EXAMPLE 1

Figure 2:
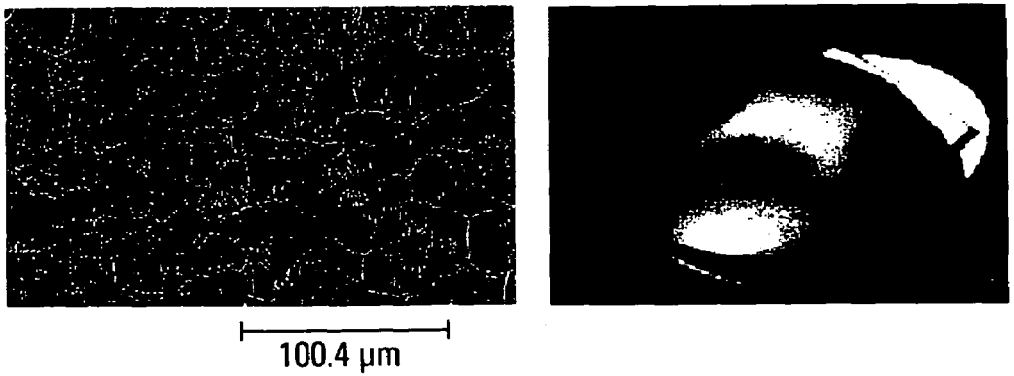
FIG. 2 shows a photomicrograph of the wafer surface obtained in comparative Example 1.

An etching solution is prepared as in Example 1, but without adding nitrate additives. The etching process of the silicon wafers is conducted as in Example 1. The etching rate, the visible test, roughness, glossiness, Δ TTV, and the amount of metal contamination of the wafer surface are measured and the results summarized in Table 1. A photograph at the visual check and the results of uneven etching on the surface of the wafer as observed by optical microscopy (1250×) are shown in FIG. 2.

COMPARATIVE EXAMPLE 2

An etching solution is prepared as in Example 11 without adding nitrate additives, and wafers are etched as in Example 1. The etching rate, the visible test, roughness, glossiness, Δ TTV, and the amount of metal contamination of the wafer surface are measured, and the results summarized in Table 1.

COMPARATIVE EXAMPLE 3

An etching solution is prepared as in Example 2, but high-purity sodium hydroxide is replaced by sodium hydroxide having several dozen ppb of conventional heavy metal and several ppm of a variety of salts. Silicon wafers are etched as in Example 1. The etching rate, the visible test, roughness, glossiness, Δ TTV, and the amount of metal contamination of the wafer surface are measured, and the results summarized in Table 1.

In the table, the amount of metal adhesion unit: [E9 atoms/cm$^2$]

| Examples | Etching rate [μm/m in] | Presence or absence of uneven etching at visible test | Roughness (Ra) [μm] | Glossiness [%] | ΔTTV [μm] | The amount of metal adhesion [E9 atoms/cm$^2$] Fe | Ni | Cu |
|---|---|---|---|---|---|---|---|---|
| Examples 1 | 2.89 | absent | 0.36 | 123.4 | 0.33 | A | A | A |
| Examples 2 | 2.89 | absent | 0.34 | 112.0 | 0.23 | B | A | A |
| Examples 3 | 2.78 | absent | 0.30 | 97.8 | 0.18 | A | A | A |
| Examples 4 | 2.45 | absent | 0.24 | 85.3 | 0.15 | B | A | A |
| Examples 5 | 2.32 | absent | 0.23 | 82.6 | 0.11 | A | A | A |
| Examples 6 | 3.00 | absent | 0.32 | 134.8 | 0.46 | A | A | A |
| Examples 7 | 3.34 | absent | 0.38 | 155.9 | 0.64 | A | A | A |
| Examples 8 | 3.04 | absent | 0.26 | 90.6 | 0.20 | B | A | A |
| Examples 9 | 2.51 | absent | 0.31 | 115.8 | 0.20 | B | A | A |
| Examples 10 | 2.85 | absent | 0.30 | 100.1 | 0.26 | A | A | A |
| Examples 11 | 2.78 | absent | 0.27 | 127.2 | 0.16 | A | A | A |
| Comparative Example 1 | 2.56 | present | 0.47 | 123.2 | 4.10 | B | A | A |
| Comparative Example 2 | 2.56 | present | 0.45 | 132.1 | 2.90 | A | A | A |
| Comparative Example 3 | 2.21 | absent | 0.27 | 98.7 | 0.17 | D | C | C |

A = from the lower than detection limit or more to less than 100
B = from 100 or more to less than 500
C = from 500 or more to less than 1000
D = 1000 or more.

The silicon wafer produced in the present invention not only has extremely low amount of metal impurities contamination but also has very excellent surface flatness.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of production of a silicon wafer, comprising providing a silicon wafer,
    etching at least one surface of said silicon wafer with an aqueous etching solution comprising
    40 to 60 wt % of high-purity sodium hydroxide, and containing
    1 ppb or less of each of the elements Cu, Ni, Mg, and Cr,
    5 ppb or less of each of the elements Pb and Fe,
    10 ppb or less of each of the elements Al, Ca, and Zn, and
    1 ppm or less of chloride, sulfate, phosphate, and nitrogen compounds other than nitrate and nitrite; and further comprising,
    0.01 to 10 wt % of nitrate.

2. The method of claim 1, wherein the surface of said silicon wafer after etching contains $1 \times 10^{10}$ atoms/cm$^2$ or less of heavy metals after etching.

3. The method of claim 1, wherein said silicon wafer after etching has a degradation of surface flatness Δ TTV of 1 μm or less.

4. The method of claim 2, wherein said silicon wafer after etching has a degradation of surface flatness Δ TTV of 1 μm or less.

5. The method of claim 2, wherein said heavy metals are one or more of Cu, Ni, Cr, Fe, Zn, and Pb.

6. The process of claim 1, wherein nitrate is present in a total amount of 0.05 to 10 weight percent.

7. The process of claim 1, wherein sodium hydroxide is present in an amount of from 50 to 55 weight percent based on the total weight of the alkali etching solution.

8. The process of claim 1, wherein the alkali etching solution further comprises from 0.01 to 20 weight percent of salts other than nitrate based on the weight of the alkali etching solution.

9. The process of claim 8, wherein at least a portion of the salts other than nitrate are formed in situ by addition of an acid.

10. The process of claim 1, wherein said etching is performed after lapping of the wafer.

11. A method of production of a silicon wafer, comprising providing a silicon wafer,
    etching at least one surface of said silicon wafer with an aqueous etching solution comprising
    40 to 60 wt % of high-purity sodium hydroxide, and containing
    not more than 1 ppb of each of the elements Cu, Ni, Mg, and Cr,
    not more than 5 ppb of each of the elements Pb and Fe,
    not more than 10 ppb of each of the elements Al, Ca, and Zn, and
    not more than 1 ppm of chloride, sulfate, phosphate, and nitrogen compounds other than nitrate and nitrite; and further comprising,
    0.01 to 10 wt % of nitrate.

12. A method of production of a silicon wafer, comprising providing a silicon wafer,
    providing an aqueous etching solution comprising:
    40 to 60 wt % of high-purity sodium hydroxide, and containing
    1 ppb or less of each of the elements Cu, Ni, Mg, and Cr,
    5 ppb or less of each of the elements Pb and Fe,
    10 ppb or less of each of the elements Al, Ca, and Zn, and
    1 ppm or less of chloride, sulfate, phosphate, and nitrogen compounds other than nitrate and nitrite; and further comprising,
    0.01 to 10 wt % of nitrate; and
    etching at least one surface of said silicone wafer with the aqueous etching solution.

* * * * *